(12) United States Patent
Elyaakoubi et al.

(10) Patent No.: US 7,595,096 B2
(45) Date of Patent: Sep. 29, 2009

(54) METHOD OF MANUFACTURING VACUUM PLASMA TREATED WORKPIECES

(75) Inventors: Mustapha Elyaakoubi, Ris-Orangis (FR); Phannara Aing, Vitry-sur-Seine (FR); Rainer Ostermann, Klaus (AT); Klaus Neubeck, Sevelen (CH); Benoit Riou, Bourg la Reine (FR)

(73) Assignee: OC Oerlikon Balzers AG, Balzers (LI)

( * ) Notice: Subject to any disclaimer, the term of this patent is extended or adjusted under 35 U.S.C. 154(b) by 389 days.

(21) Appl. No.: 10/898,458

(22) Filed: Jul. 23, 2004

(65) Prior Publication Data

US 2005/0051269 A1 Mar. 10, 2005

Related U.S. Application Data

(60) Provisional application No. 60/491,183, filed on Jul. 30, 2003.

(51) Int. Cl.
*C23C 14/02* (2006.01)
*H05H 1/24* (2006.01)

(52) U.S. Cl. .................. 427/534; 427/535; 427/569; 427/579; 134/1.1

(58) Field of Classification Search .............. 427/569, 427/534, 535, 579; 134/1.1
See application file for complete search history.

(56) References Cited

U.S. PATENT DOCUMENTS

| 4,786,352 A * | 11/1988 | Benzing .............. 156/345.48 |
|---|---|---|
| 4,822,450 A * | 4/1989 | Davis et al. ............. 438/709 |
| 5,418,019 A * | 5/1995 | Chen et al. ............... 427/579 |
| 5,455,138 A * | 10/1995 | Okamura et al. ......... 430/128 |
| 5,563,092 A * | 10/1996 | Ohmi .................... 438/485 |
| 5,688,330 A * | 11/1997 | Ohmi .................... 118/723 E |
| 5,882,424 A * | 3/1999 | Taylor et al. ............... 134/1.1 |
| 6,077,386 A * | 6/2000 | Smith et al. ............ 156/345.24 |
| 6,184,158 B1 * | 2/2001 | Shufflebotham et al. .... 438/788 |
| 6,410,102 B1 * | 6/2002 | Hashizume et al. ......... 427/534 |
| 7,205,034 B2 * | 4/2007 | Kawamura et al. .......... 427/569 |
| 2002/0052069 A1 * | 5/2002 | Jiroku et al. ................ 438/166 |
| 2002/0192984 A1 | 12/2002 | Hiyama |
| 2005/0087305 A1 * | 4/2005 | Nishio et al. ........... 156/345.51 |
| 2006/0150913 A1 * | 7/2006 | Wang et al. ............. 118/723 IR |
| 2006/0172542 A1 * | 8/2006 | Bera et al. ................ 438/706 |
| 2007/0175495 A1 * | 8/2007 | Kim et al. .................... 134/1.2 |
| 2009/0101283 A1 * | 4/2009 | Iwata ..................... 156/345.28 |

FOREIGN PATENT DOCUMENTS

EP 0 578 010 A 12/1994

OTHER PUBLICATIONS

Choi, In S., et al., "Application of medium frequency atmospheric plasma on continuous aluminum wire cleaning for magnet wire manufacturing". Surface and Coatings Technology 142-144 (2001) pp. 300-305.*

Gletn Technologies, Inc. brochure, "Low vs High Frequency Plasma Excitation". pp. 1-2, no date available.*

* cited by examiner

*Primary Examiner*—Bret Chen
(74) *Attorney, Agent, or Firm*—Pearne & Gordon LLP

(57) ABSTRACT

A method of manufacturing vacuum plasma treated workpieces includes the steps of introducing at least one workpiece to be treated into a vacuum chamber; treating the workpiece in the vacuum chamber, thereby establishing a plasma discharge in the vacuum chamber by a supply signal with maximum energy at a first frequency which is at least in the Hf frequency range; removing the workpiece treated from the vacuum chamber; performing a cleaning inside the vacuum chamber, thereby establishing the plasma discharge by a supply signal with maximum energy at a second frequency higher than the Hf frequency; and repeating these steps at least one time.

21 Claims, 2 Drawing Sheets

METHOD OF MANUFACTURING VACUUM PLASMA TREATED WORKPIECES

Figure 1:
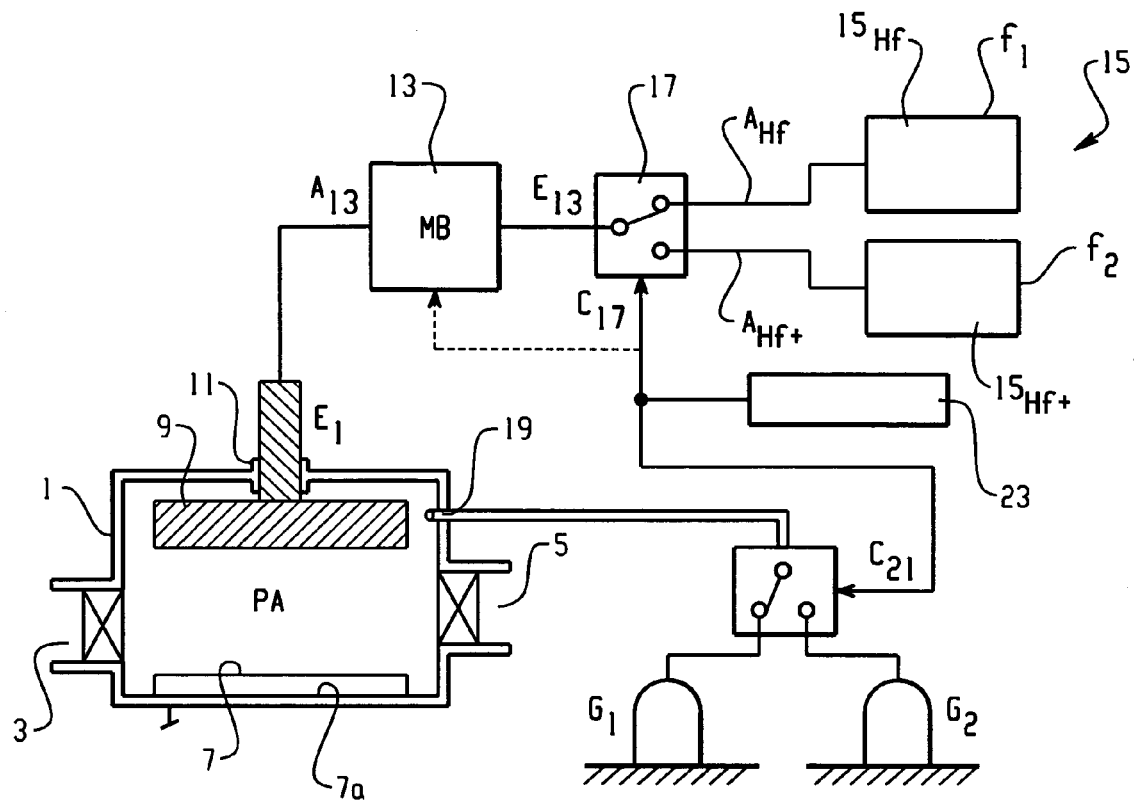

The present invention refers generically to methods and systems for vacuum plasma treating workpieces of that kind where after treating one or more than one workpiece simultaneously or subsequently in a vacuum recipient, the vacuum recipient must be cleaned before proceeding to further treatments therein.

Thereby, treatment as addressed by the present invention is of that kind where a plasma is applied which is supplied by a supply signal having maximum energy at a frequency which is in the high frequency range.

We define:

| | |
|---|---|
| High frequency range: | 3 to 30 MHz |
| Very high frequency range (VHF): | 30 to 300 MHz |

Overall cycle time and thus throughput of such methods and systems is significantly governed by the cycle time of the treatment and the cycle time of the cleaning. This is clearly especially true if after each treatment cycle a cleaning cycle is performed. The overall cycle time may be shortened—according to an increased throughput—by shortening the treatment cycle for establishing a desired treatment result. This accords with rising the treatment efficiency during the treatment cycle. It is known that treatment efficiency of treatment processes which make use of high frequency plasma may be risen by increasing the treatment plasma frequency. It is e.g. known that in plasma enhanced chemical vapor deposition treatment processes making use of high frequency plasma—$P_{Hf}ECVD$—the deposition rate may be risen by rising the plasma frequency, thereby shortening the treatment cycle.

It is also known that when rising the frequency of a high frequency plasma used for workpiece treatment up to and into the VHF frequency range this may cause problems with respect to the uniformity of the treatment effect along a workpiece surface, especially if such surface is large, which is e.g. often true for such $_{Hf}PECVD$ treatment, as for manufacturing flat panel displays, semiconductor devices, solar cell workpieces or workpieces with photosensitive film. These problems of uniform treatment effect at very high treatment plasma frequencies have been addressed and are resolved, e.g. as described in the U.S. Pat. No. 6,228,438, by a special electrode conception. Thus, and with an eye on the treatment cycle, decreasing cycle time by increasing the plasma frequency is known and the accompanying problems especially with respect to treatment homogeneity or uniformity are solved.

Nevertheless, and as was addressed above, the overall cycle and thus the throughput are also governed by the cleaning cycle time for cleaning the vacuum recipient, wherein treatment of the workpieces has been and is performed.

Shortening the cleaning cycle time in treatment processes of the type as addressed by the present invention is a topic which is dealt with in the U.S. Pat. No. 6,410,102. Thereby, it is proposed to decrease the cleaning time by a dry etching technique using a plasma with a frequency which is lower than the frequency of the plasma used for workpiece treatment.

In the U.S. Pat. No. 6,410,102 there is reported a non-uniform dry etching effect when rising the plasma frequency for dry etching above the VHF band of 50 MHz or more, leading to inaccurate cleaning of the vacuum recipient. The treatment plasma is operated in the VHF band or above.

It is an object of the present invention to shorten the cleaning cycle relative to the treatment cycle time in a treatment/cleaning system or manufacturing method as mentioned. This is realized according to the present invention by a method of manufacturing vacuum plasma treated workpieces which comprises the steps of (a) introducing at least one workpiece to be treated into a vacuum recipient;

(b) treating the workpiece in the vacuum chamber, thereby establishing a plasma discharge in the vacuum chamber by a supply signal with maximum energy at a first frequency which is at least in the Hf frequency range;

(c) removing the workpiece treated from the vacuum recipient;

(d) performing a cleaning inside the vacuum recipient, thereby establishing a plasma discharge by a supply signal with maximum energy at a second frequency which is higher than the addressed first frequency, and (e) repeating the steps (a) to (d) at least one time.

The inventors of the present invention have recognized that whenever the cycle time for treating the workpieces is shortened by establishing the frequency of the treatment plasma in the Hf-range, the respectively gained advantage with respect to throughput may be attenuated by accordingly shortening the cleaning cycle time in that the frequency of the cleaning plasma is accordingly risen or maintained above the frequency of the treatment plasma.

If for shortening the treatment cycle time by increasing treatment plasma frequency special electrode conceptions have to be applied—for resolving the treatment homogeneity problem, then these measures will also counteract inhomogeneous cleaning at an accordingly high frequency of the cleaning plasma.

Further, the inventors have recognized that by rising the frequency of the cleaning plasma and keeping it well above the high frequency of the treatment plasma, it becomes possible to increase the plasma power, from the step (b) to the step (d), thereby additionally preventing inaccurate cleaning and shortening the cleaning cycle time.

By maintaining the frequency of the cleaning plasma well above the high frequency of the treatment plasma during cleaning the ion bombardment of the chamber walls and the electrode which may lead to sputtering is reduced. This allows to significantly increase plasma power. By increasing or keeping the frequency of the cleaning plasma well above the high frequency of the treatment plasma the sheath voltage in front of the inner surface of the electrodes and thus also of the inner surface of the recipient acting as electrode is drastically reduced which reduces the energy of ions bombarding such electrode surfaces. Therefore, much higher power may be applied which overcompensates a possible unevenness of cleaning effect along the recipient wall, before a critical power is reached at which surface sputtering becomes apparent.

In one embodiment of the method according to the present invention the steps of introducing (a) up to and including removing (c) are repeated at least one time before a subsequent cleaning step (d) is performed. This means that the vacuum recipient may first be used for respectively treating at least one workpiece in at least two subsequent treatment cycles or even more before a cleaning cycle is established.

For more critical workpiece treatment and as a further embodiment after each treatment and removing cycle a cleaning cycle is performed which is established by directly proceeding from removing step (c) to cleaning step (d).

In a further embodiment during the cleaning step (d) a total pressure in the vacuum recipient is established, $p_{tot}$, for which there is valid $$0.2 \text{ mbar} \leq p_{tot} \leq 0.6 \text{ mbar}.$$

Thereby, relatively long mean free paths of the plasma activated gas radicals are established during cleaning. This leads to efficient cleaning even in small holes and gaps. In spite of the fact that low pressures rather lead to limitation of the cleaning rate and to increased ion energy bombarding the inside surfaces, it is due to the fact that the cleaning plasma frequency is kept well above the high frequency of the treatment plasma, that these effects are overcompensated.

In a further embodiment of the method according to the present invention during the cleaning step a fluorine containing gas is applied into the vacuum recipient.

In a further embodiment at least one of $SF_6$ and of $NF_3$ is applied.

In one embodiment the addressed first frequency, the frequency of the treatment plasma, $f_1$, is selected to be:

$$10 \text{ MHz} \leq f_1 \leq 30 \text{ MHz}.$$

In a further embodiment the addressed first frequency $f_1$ is selected to be about 13.56 MHz.

In a further embodiment the second frequency $f_2$ according to the cleaning plasma frequency is selected to be a harmonic of the first frequency $f_1$.

In a still further embodiment the second frequency $f_2$ is selected in the VHF frequency range.

Still in a further embodiment it is the first frequency $f_1$ which is selected in the VHF frequency range.

Still in a further embodiment the second frequency $f_2$ is selected:

$$30 \text{ MHz} \leq f_2 \leq 100 \text{ MHz}.$$

Still in a further embodiment the second frequency $f_2$ is selected to be approx. 40 MHz.

Still in a further embodiment the second frequency $f_2$ too is selected in the high frequency range. Thereby, still in a further embodiment $f_2$ is selected $$20 \text{ MHz} \leq f_2 \leq 30 \text{ MHz}.$$

Still in a further embodiment $f_2$ is selected to be about 27 MHz, which is about the first harmonic of $f_1$ selected to be about 13.56 MHz, as selecting $f_2$ to be about 40 MHz accords to the second harmonic of that $f_1$.

In a further embodiment the second frequency $f_2$ is selected to be at least double the first frequency $f_1$.

In a further embodiment of the method according to the present invention workpiece surfaces are treated which are at least 2000 cm².

Still in a further embodiment during the treatment step (b) a SiN coating is deposited on the workpiece.

Still in a further embodiment during the treatment step (b) there is performed at least one of PVD and PECVD and in a still further embodiment such treating step (b) consists of a PECVD treatment.

Still in a further embodiment of the method according to the present invention flat workpieces are produced, in a further embodiment flat panel display workpieces, i.e. workpieces which are used for flat panel display manufacturing.

Still in a further embodiment solar cell workpieces are manufactured or workpieces with photosensitive film or workpieces for semiconductor workpieces.

According to the present invention there is further proposed a system for vacuum plasma treating workpieces which comprises an evacuatable vacuum recipient;
a gas inlet arrangement in the recipient connectable to a first gas supply and to a second gas supply;
a plasma generating arrangement in the recipient with an electric input to an electrode;
a generator arrangement with a first and a second output and generating at the first output a signal with maximum power at a first frequency which is in the high frequency range and at the second output a signal with maximum power at a second frequency which is higher than the first frequency;
a control unit which alternatively operationally connects the first output of the generator arrangement to the electric input of the plasma generating arrangement in the recipient and the first gas supply to the gas inlet or which connects the second output of the generator arrangement to the electric input and the second gas supply to the gas inlet.

The invention shall now be described with the help of figures and by means of examples.

Figure 2:
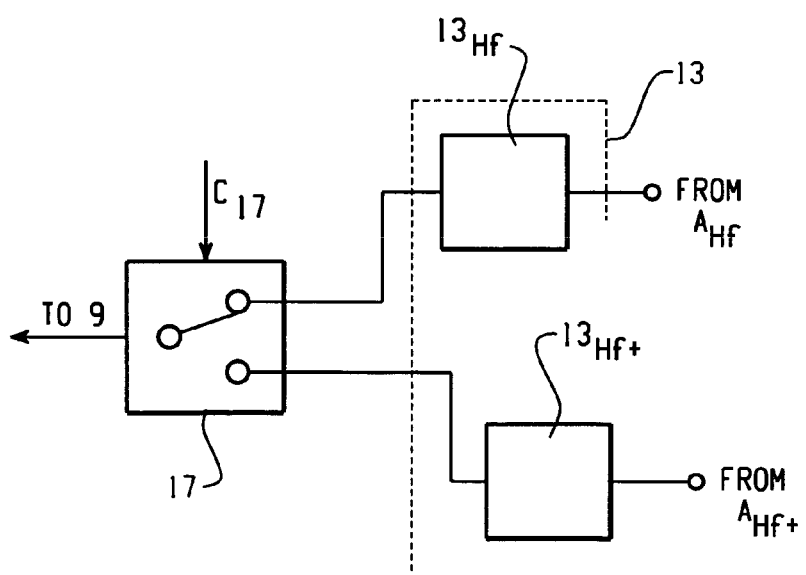
Figure 3:
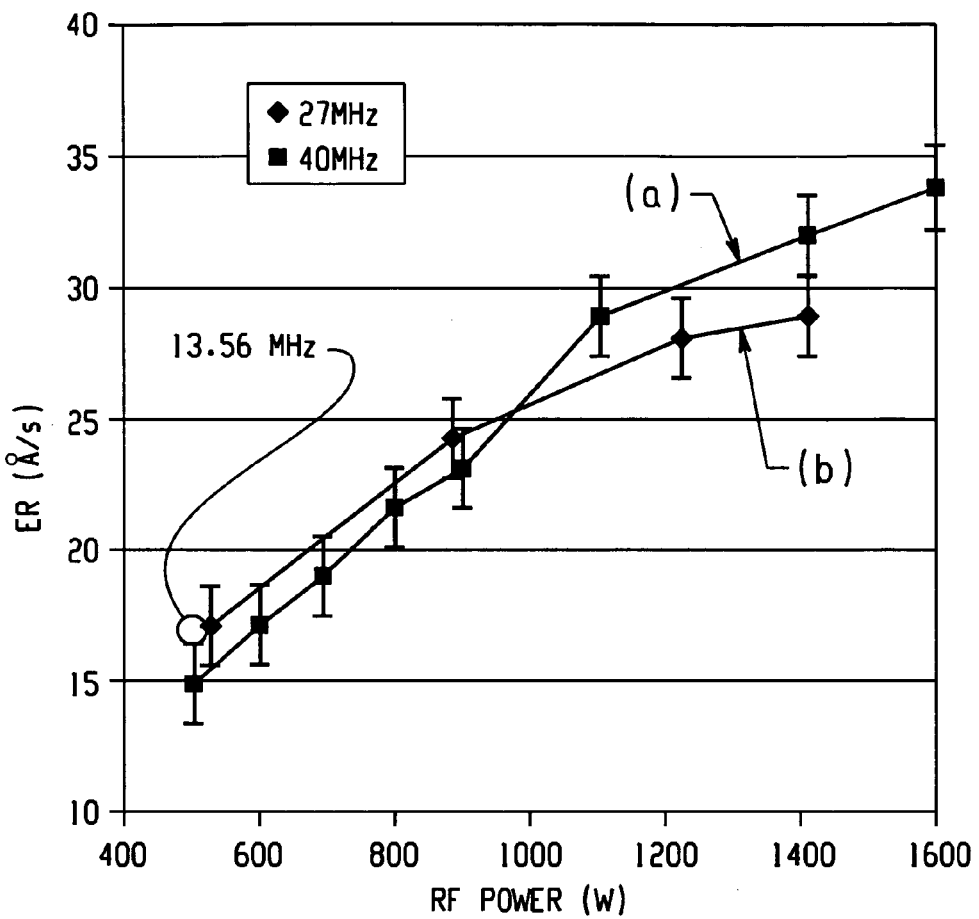
Figure 4:
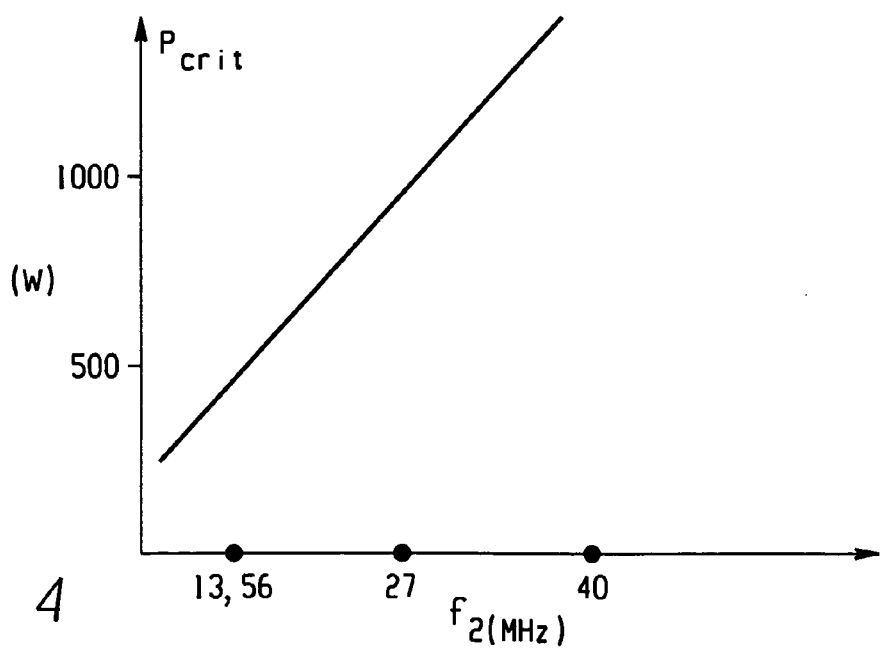

The figures show:

FIG. 1 schematically, a first embodiment of the system according to the present invention and performing the manufacturing method according to the present invention;

FIG. 2 a part of the inventive system as of FIG. 1 in a further variant;

FIG. 3 a representation of cleaning rate (Å/s) vs. Rf power (w) when performing cleaning according to the manufacturing method and with a system according to the present invention at cleaning plasma frequencies above treatment plasma frequency, and FIG. 4 a representation of sputter-critical plasma power vs. plasma frequency in the system and method according to the present invention.

In FIG. 1 there is schematically shown a first embodiment of a system according to the present invention performing the manufacturing method according to this invention.

A vacuum recipient 1 has an input loadlock 3 and an output loadlock 5. Workpieces as flat substrates 7, especially for manufacturing flat panel displays or solar cells or substrates with photosensitive films, especially with large surfaces to be treated of at least 2000 cm² are input by input loadlock 3 and deposited on a substrate-receiving surface 7a. According to FIG. 1 bottom surface of the recipient 1 is used as substrate receiving surface 7a. After treatment the substrate 7 is unloaded via output loadlock 5. Instead of a single workpiece, in some applications, batches of more than one workpiece may be simultaneously fed to the vacuum recipient 1. Within vacuum recipient 1 and opposite to the workpiece-receiving surface 7a—here acting as one electrode—there is provided a second electrode arrangement 9 connected to an electric input $E_1$ at the recipient 1 via an isolating feed-through 11 through the wall of recipient 1.

The electric input $E_1$, according to the embodiment of FIG. 1, is operationally connected to an output $A_{13}$ of a matchbox arrangement 13, the input $E_{13}$ of which being operationally connectable either to a first output $A_{Hf}$ or to a second output $A_{Hf+}$ of a generator arrangement 15. The generator arrangement 15 generates as by a generator stage $15_{Hf}$ at output $A_{Hf}$ a signal with maximum energy at a frequency $f_1$ which is in the high frequency range. The arrangement 15 further generates at output $A_{Hf+}$ an electric signal with maximum energy at a frequency $f_2$ which is higher than frequency $f_1$. As schematically shown by the controlled switching unit 17, electrode 9 is either operationally connected to output $A_{Hf}$ or to output $A_{Hf+}$.

The switching unit 17 has a control input $C_{17}$.

The electrode arrangement 9 as well as the workpiece support surface 7a may be shaped according to the specific needs, e.g. so as to deal with high frequency plasma caused inhomogeneous treatment effect on the substrate surface as e.g. shown in the U.S. Pat. No. 6,228,438.

The vacuum recipient 1 has further a gas inlet 19 which is flow-connected via a controlled flow switching unit 21 either to a gas supply G1 or to a gas supply G2. The flow switching unit 21 has a control input $C_{21}$.

The switching unit 17 as well as the flow switching unit 21 are controlled via their respective control inputs $C_{17}$ and $C_{21}$ by a process cycle control unit 23. Further, it has to be noted that in spite of the fact that in FIG. 1 there is provided one matchbox arrangement 13 and the wall of the recipient 1 is shown to be connected on a reference potential, e.g. on ground potential, it is also possible to apply high frequency electric voltage between electrode arrangement 9 and substrate support surface 7a differently, as by connecting the wall of recipient 1 via a second matchbox arrangement on a reference potential or even by feeding Rf energy via a matchbox arrangement to recipient 1. Nevertheless, it will be more customary to tighten recipient 1 as shown to a reference potential. Once a substrate 7 has been introduced into recipient 1 a high-frequency plasma-assisted treatment is performed thereon. To do so, control unit 23 operates switching unit 17 to supply electrode arrangement 9 with electric energy from output $A_{Hf}$ of generator arrangement 15. The high frequency plasma assisted treatment may be a reactive or a non-reactive PVD treatment, but is in a high-frequency plasma-enhanced CVD treatment. Thus, especially for such treatment, a treatment gas, possibly with an operating gas as e.g. Argon, is fed via inlet 19 from gas supply $G_1$ into recipient 1. This is controlled by unit 23 and flow control unit 21.

As soon as the high frequency plasma treatment of the substrate 7 is terminated, the yet treated substrate is removed from recipient 1 via output loadlock 5. Subsequently, the inside of recipient 1 has to be cleaned from contamination depositions which are due to substrate treatment as from film deposition or etching during the high-frequency plasma-assisted treatment.

The subsequent cleaning cycle is performed directly after each treatment cycle of workpieces or, in less critical applications, after a predetermined number of treatment cycles having been performed.

For the cleaning cycle electrode 9 is electrically operationally connected to output $A_{Hf+}$ of generator arrangement 15, controlled by control unit 23 and switching unit 17. Simultaneously and in most cases the gas applied to recipient 1 via gas inlet 19 is switched by control unit 23 and flow control unit 21 to the second gas supply $G_2$. For cleaning purposes this gas supply $G_2$ may contain fluorine, thereby $SF_6$ and/or $NF_3$. Possibly also oxygen is contained in gas supply $G_2$. As the signal generated by the generator arrangement 15 at output $A_{Hf+}$ has a frequency $f_2$ which is higher than the frequency $f_1$ generated at output $A_{Hf}$, the cleaning cycle plasma is supplied by a supply signal having maximum energy at a higher frequency than during the treatment cycle.

We refer to the frequency of "maximum energy" taking into account that the output signals of generator arrangement 15 need not be sinusoidal, and will normally provide for an accordingly distributed frequency spectrum characterized by maximum energy at a specific spectral frequency.

With respect to specific embodiments how to operate and construe the system according to FIG. 1 we refer to the introductory part and the specific embodiments addressed therein.

If the two frequencies $f_1$ and $f_2$ are spectrally too wide apart from each others, it might become difficult to tailor matchbox arrangement 13 to be good enough for both frequencies. Then either the matchbox arrangement 13 is also controlled for adaptation to the respective frequency $f_1$ and $f_2$ as shown in dashed lines in FIG. 1 or, according to FIG. 2, the matchbox arrangement comprises two separate matchboxes $13_{Hf}$ and $13_{HF+}$, which become enabled together with the respective supply.

EXAMPLES

Glass substrates with a surface to be treated of 410×520 mm² were coated in respective treatment steps in a system according to FIG. 1 with a SiN layer, thereby selecting treatment plasma frequency $f_1$=13.56 MHz. Then the substrates were removed from recipient 1.

After the respective coating a subsequent cleaning step was performed with $SF_6$ and $O_2$ inlet into the recipient 1 from gas supply $G_2$ as of FIG. 1. The gas flow was as follows for all examples:

| | |
|---|---|
| $SF_6$: | 500 sccm |
| $O_2$: | 100 sccm |

The total pressure $p_{tot}$ in recipient 1 during all the cleaning cycles was 0.4 mbar.

First, cleaning from SiN was performed at a frequency $f_2$=13.56 MHz and at a power applied of about 500 W. This power of 500 W was about the limit power $P_{crit}$ before starting damaging the electrode due to ion bombardment and resulting electrode sputtering.

Then $f_2$ was risen respectively to $f_2$=27 MHz and to $f_2$=40 MHz. At these frequencies $f_2$ the Rf power was varied. The results are shown in FIG. 3. The course (a) shows the dependency of cleaning rate in Å/s from Rf power in W at $f_2$=27 MHz, course (b) at 40 MHz. It was recognized that with rising frequency $f_2$ of the cleaning plasma, the Rf power as applied may also be considerable without reaching $P_{crit}$.

It was found that the critical power $P_{crit}$ in dependency of $f_2$ has a course as approximately shown in FIG. 4.

Therefrom, it might be seen that with rising frequency $f_2$ the plasma power may also be risen substantially without reaching $P_{crit}$ and incurring the risk of sputtering the electrode and the wall surfaces.

Thus, it becomes possible to combine shortening treatment cycles time by rising the frequency of the treatment plasma and simultaneously to shorten the treatment cycle time by keeping the frequency of the cleaning plasma still higher than the frequency of the treatment plasma, thereby even rising the power of the cleaning plasma. Thus, the overall cycle time is substantially shortened and accordingly throughput of workpieces through the system according to the present invention and the respective method for manufacturing is substantially increased.

In the following table the rates of reactor cleaning performed at frequency values for $f_2$ of 13.56 MHz and of 27 MHz are shown. Cleaning is performed with $SF_6/O_2$. Thereby, a contamination layer in the reactor of SiN and of amorphous silicon deposited at low deposition rates, a-Si-LDR, is removed. For both frequency values the Rf power applied was just below $P_{crit}$ where surface sputtering of electrode surfaces and recipient wall surfaces starts. It may be seen that at $f_2$=27 MHz considerably higher cleaning rates are realized due to higher power which is applicable.

| Process | Frequency (MHz) | SF6/O2 (sccm) | Pressure (mBar) | RF (W) | Cleaning rate (Å/s) |
|---------|-----------------|---------------|-----------------|--------|---------------------|
| SiN | 13.56 | 500/100 | 0.4 | 500 | 17.5 |
|  | 27 | 500/100 | 0.4 | 875 | 24 |
| a-Si-LDR | 13.56 | 500/100 | 0.4 | 500 | 13 |
|  | 27 | 500/100 | 0.4 | 875 | 22.5 |

The invention claimed is:

1. A method of manufacturing vacuum plasma treated workpieces comprising the steps of
   (a) introducing at least one workpiece to be treated into a vacuum chamber;
   (b) treating said workpiece in said vacuum chamber, thereby establishing a plasma discharge in said vacuum chamber by a supply signal with maximum energy at a first frequency $f_1$ for which there is valid;

$$10 \text{ MHz} \leq f_1 \leq 30 \text{ MHz}$$

(c) removing said workpiece treated from said vacuum chamber;
   (d) performing a cleaning inside said vacuum chamber, thereby establishing said plasma discharge by a supply signal with maximum energy at a second frequency $f_2$ higher than said first frequency;
   (e) repeating steps (a) to (d) at least one time, wherein said method further comprises selecting said second frequency $f_2$ to be:

$$30 \text{ MHz} < f_2 < 100 \text{ MHz}$$

raising said second frequency $f_2$ during the step (d), and increasing the Rf power at said second frequency $f_2$ in dependency of said raising said second frequency $f_2$ and to be below a critical power but avoiding initiation of sputtering.

2. The method of claim 1, further comprising repeating said introducing step (a) up to an including said removing step (c) at least one time before proceeding to said cleaning step (d).

3. The method of claim 1, further comprising directly transiting from said removing step (c) to said cleaning step (d).

4. The method of one of claims 1 to 3, further comprising establishing during said cleaning step (d) a total pressure in said vacuum chamber $p_{tot}$ for which there is valid:

$$0.2 \text{ mbar} \leq p_{tot} \leq 0.6 \text{ mbar.}$$

5. The method of claim 1, further comprising providing during said cleaning step (d) a fluorine containing gas in said vacuum recipient.

6. The method of claim 1, further comprising providing at least one of $SF_6$ and of $NF_3$ in said vacuum recipient during said cleaning step (d).

7. The method of claim 1, further comprising selecting said first frequency $f_1$ to be about 13.56 MHz.

8. The method of claim 1, further comprising selecting said second frequency to be a harmonic of said first frequency.

9. The method of claim 1, further comprising selecting said second frequency to be about 40 MHz.

10. The method of claim 1, further comprising selecting said second frequency $f_2$ at least double said first frequency $f_1$.

11. The method of claim 1, thereby manufacturing workpieces with a treated surface larger than 2000 cm$^2$.

12. The method of claim 1, said treating comprising coating with SiN.

13. The method of claim 1, wherein said treating comprises at least one of physical vapor deposition—PVD—and of plasma enhanced chemical vapor deposition—PECVD.

14. The method of claim 1, wherein said treating is plasma enhanced chemical vapor deposition PECVD.

15. The method of claim 1, wherein said workpieces are flat workpieces.

16. The method of claim 1, wherein said workpieces are workpieces for flat panel displays.

17. The method of claim 1, wherein said workpieces are solar cell workpieces.

18. The method of claim 1, wherein said workpieces are workpieces with a photosensitive film.

19. The method of claim 1, wherein said workpieces are workpieces for semiconductor workpieces.

20. The method of claim 1, further comprising generating said supply signal with said first frequency by a first generator and generating said supply signal with said second frequency by a second generator and applying both said supply signals to common electrodes in said vacuum recipient via a common matchbox arrangement or via respective first and second matchboxes arrangements.

21. A method of manufacturing vacuum plasma treated workpieces comprising the steps of
   (a) introducing at least one workpiece to be treated into a vacuum chamber;
   (b) treating said workpiece in said vacuum chamber, thereby establishing a plasma discharge in said vacuum chamber by a supply signal with maximum energy at a first frequency $f_1$ for which there is valid;

$$10 \text{ MHz} \leq f_1 \leq 30 \text{ MHz}$$

(c) removing said workpiece treated from said vacuum chamber;
   (d) performing a cleaning inside said vacuum chamber, thereby establishing said plasma discharge by a supply signal with maximum energy at a second frequency $f_2$ higher than said first frequency;
   (e) repeating steps (a) to (d) at least one time, wherein said method further comprises selecting said second frequency $f_2$ to be:

$$30 \text{ MHz} < f_2 < 100 \text{ MHz}$$

raising said second frequency $f_2$ during the step (d), and increasing the Rf power from the step (b) to the step (d) to a value depending on said second frequency $f_2$ and to be below a critical power but avoiding initiation of sputtering at said second frequency $f_2$.

* * * * *

UNITED STATES PATENT AND TRADEMARK OFFICE
CERTIFICATE OF CORRECTION

PATENT NO. : 7,595,096 B2  Page 1 of 1
APPLICATION NO. : 10/898458
DATED : September 29, 2009
INVENTOR(S) : Elyaakoubi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 753 days.

Signed and Sealed this

Twenty-eighth Day of September, 2010

David J. Kappos
*Director of the United States Patent and Trademark Office*